United States Patent [19]
Shiotsuka et al.

[11] Patent Number: 6,162,986
[45] Date of Patent: Dec. 19, 2000

[54] SOLAR CELL MODULE AND METHOD OF MANUFACTURING THE SAME

[75] Inventors: Hidenori Shiotsuka, Kyotanabe; Tsutomu Murakami; Takehito Yoshino, both of Nara; Koji Tsuzuki, Ikoma; Ichiro Kataoka, Kyotanabe; Satoru Yamada, Nara; Yoshifumi Takeyama, Soraku-gun; Koichi Shimizu, Kyotanabe; Shigeo Kiso, Kyotanabe; Hideaki Zenko, Kyotanabe, all of Japan

[73] Assignee: Canon Kabushiki Kaisha, Tokyo, Japan

[21] Appl. No.: 09/330,601

[22] Filed: Jun. 11, 1999

[30] Foreign Application Priority Data

Jun. 12, 1998 [JP] Japan .................................. 10-179811
Jan. 25, 1999 [JP] Japan .................................. 11-015087
Jun. 8, 1999 [JP] Japan .................................. 11-160549

[51] Int. Cl.⁷ ..................................................... H01L 25/00
[52] U.S. Cl. .............................................................. 136/244
[58] Field of Search ............................................... 136/244

[56] References Cited

FOREIGN PATENT DOCUMENTS

| | | |
|---|---|---|
| 61-41261 | 3/1986 | Japan . |
| 6-27964 | 4/1994 | Japan . |
| 7-26849 | 5/1995 | Japan . |
| 8-204220 | 8/1996 | Japan . |
| 9-097918 | 4/1997 | Japan . |
| 2666097 | 6/1997 | Japan . |

*Primary Examiner*—Mark Chapman
*Attorney, Agent, or Firm*—Fitzpatrick, Cella, Harper & Scinto

[57] ABSTRACT

A solar cell module has a very agreeable appearance and can carry a large volume of information on the light receiving surface thereof. An information carrying body storing information (including, for example, the date, the process the rated values, the destination of shipment, I-V curve data and other data) for identifying the module is invisibly arranged on the light receiving surface side of the solar cell module (e.g., on the front surface sealing member or the front surface member of the photovoltaic elements).

18 Claims, 3 Drawing Sheets

SOLAR CELL MODULE AND METHOD OF MANUFACTURING THE SAME

BACKGROUND OF THE INVENTION

1. Field of the Invention

This invention relates to a solar cell module having a highly agreeable appearance and capable of storing a large volume of information relating to the solar cell module itself that is recorded on the light receiving surface.

2. Related Background Art

Firstly, a known popular solar cell module will be described by referring to FIGS. 4A and 4B of the accompanying drawings.

FIGS. 4A and 4B illustrate a known solar cell module. FIG. 4A is a schematic perspective view and FIG. 4B is a cross sectional view taken along line 4B—4B in FIG. 4A.

As seen from FIGS. 4A and 4B, the known solar cell module 300 comprises a host of photovoltaic elements 301 covered by a front surface member 303, a front surface sealing member 302, rear surface sealing members 304 and a rear surface member 306. In the case of the illustrated solar cell module, the rear surface member 306 is bored through at a pair of longitudinally and oppositely arranged positions to lead out respectively the positive electrode and the negative electrode, which are then connected to the respective terminal boxes 307, 308 and electric wires 309 in order to output electric power. The electric wires 309 are in turn connected to respective connectors 310, 311.

In the manufacturing process for such known solar cell modules 300, the date, the process, the rated values, the destination of shipment and other data identifying each module 300 or each batch of photovoltaic elements 301 are normally logged and controlled by using serial control (ID) numbers allocated to solar cell modules.

More specifically, such a known solar cell module 300 is typically provided with a display section 312 carrying a name plate thereon and arranged on the rear surface thereof. The ID number of the solar cell module 300 is carried on the name plate of the display section 312 in an attempt to raise the ratio of the area dedicated to the photovoltaic function of the module relative to the entire surface area of the light receiving front surface. The control number carried on the name plate of the display section 312 may take the form of a bar code.

Such a known solar cell module 300 can experience problems as identified below due to the arrangement of the name plate of the display section 312 carrying the control number thereon on the rear side of the solar cell module 300.

Firstly, when manufacturing solar cells 300, each solar cell module 300 has to be turned upside down when gluing a name plate to the display section 312 and inspecting the solar cell module 300. In this way the light receiving front surface member 303 of the solar cell module 300 can inadvertently be damaged thereby reducing the manufacturing yield.

Meanwhile, solar cell modules 300 can improve their photovoltaic effect when suitably arranged in array.

For example, a solar cell module array can be optimally designed to minimize the power loss on the basis of I-V curve data of the solar cell modules. Then, solar cell modules 300 will be arranged or combined according to the design before they are shipped.

However, on the site of installing the solar cell modules 300, they will have to be turned upside down once again in order to identify their respective control numbers if they cannot be identified by viewing the light receiving surfaces thereof. Then, if any of the solar cell modules 300 are seriously damaged in the process of being turned upside down and have to be replaced, a solar cell module array incorporating the replaced solar cell modules will have to be optically designed once again for array arrangement. It is very difficult to realize an optimal array design on site.

Additionally, when solar cell modules 300 are used outdoors for a prolonged period of time, the front surface members 303 of the solar cell modules 300 can become damaged by foreign objects that collide with the front surface members, particularly on windy days during storm seasons. The damaged solar cell modules 300 should be replaced. Hence, the type of damaged solar cell modules 300 and that of their connectors 310, 311 must be identified by viewing the display sections 312 of the damaged solar cell modules 300 and their replacements are brought in accordingly.

If the light receiving surfaces of the damaged solar cell modules 300 do not say anything about their types, then all the solar cell modules 300 from the top row down to the rows of the damaged solar cell modules 300 of the array will have to be removed to identify their respective control numbers. If the solar cell module array is arranged on a roof and such a cumbersome operation of identifying the control numbers must be carried out, then the replacement time for the solar cell modules 300 is enormous and the roof must remain partly dismantled during that time. Thus, it is highly desirable that solar cell modules 300 carry their respective control numbers and other data on the light receiving surfaces thereof, from a servicing point of view.

In an attempt to solve the above identified problems relating to arranging a display section on the light receiving surface of each solar cell module, the following proposals are known to date.

For example, Japanese Utility Model Publication No. 61-41261 describes a technique of arranging a cut-through pattern of characters and other symbols in the photoelectric conversion area of a solar battery and filling the cut-through pattern with an insulating material showing a desired color. In this way, the characters and the symbols of the pattern may be visibly displayed and recognized due to the color difference between the insulator and the semiconductor layer.

Japanese Utility Model Publication No. 5-38464 described a colored solar cell module. According to the patent document, a solar cell module is provided on the surface of the solar cells with a color filter adapted to transmit light with a wavelength band that contributes to the photovoltaic effect of the solar cell module and a color scattering layer for transmitting part of the light transmitted through the filter and irregularly scattering the remaining part of the light.

Japanese Utility Model Publication No. 6-27964 describes a technique of arranging solar cells and color scattering reflector panels into a mosaic so that characters and other symbols may be visibly displayed and recognized by means of the color scattering reflector panels of the mosaic.

Japanese Utility Model Publication No. 7-26849 describes a technique of arranging an identification pattern formed in a laminate of a transparent electrode, an amorphous silicon layer and a metal layer formed on an insulating substrate that transmit light in a solar battery.

Japanese Patent Application Laid-Open No. 8-204220 describes a technique of partly modifying the direction of reflection and the reflectivity of the photovoltaic layer of a solar battery by making it project an undulated profile and visually display a desired pattern.

Japanese Patent Application Laid-Open No. 9-97918 describes a technique of displaying characters and other symbols on the light receiving surface of a solar cell module by differentiating the surface contour of a coating member and of a neighboring area of the surface of the module.

However, the above listed known techniques are accompanied respectively by the following problems.

While the techniques as disclosed in Japanese Utility Model Publications Nos. 61-41262, 6-27964 and 5-38464 and Japanese Patent Applications Laid-Open Nos. 8-204220 and 9-97918 can minimize the reduction in the photovoltaic effect of a solar cell module and allow the characters and other symbols it carries to be clearly recognizable, the storable volume of information remains limited because information cannot be stored densely in a given area.

The technique as disclosed in Japanese Utility Model Publication No. 7-26849 takes away from the appearance of the solar cell module to which the technique is applied because an information carrying body is arranged on the light receiving surface of the solar cell module and carries a visible pattern of bar codes and/or some other data.

In short, with any of the above listed known techniques, an information carrying body is visibly placed on the light receiving surface of a solar cell module. None of the above patent documents discloses an information carrying body that carries information invisibly.

Additionally, no techniques are known to date that arrange an information carrying body on the light receiving surface of a solar cell module carrying data such as the electric characteristics of the product obtained on the basis of the I-V curve data of production, in addition to the date, the process, the rated values, the destination of shipment and other data for the product.

SUMMARY OF THE INVENTION

Therefore, it is the object of the present invention to provide a solar cell module carrying a large volume of information on the light receiving surface thereof and having a very agreeable appearance that is free from the problems of known solar cell modules and a method of manufacturing such a solar cell module.

According to the invention, the above object is achieved by providing a solar cell module having an information carrying body invisibly arranged on the light receiving surface side and carrying information about the solar cell module.

Preferably, in a solar cell module according to the invention, said information carrying body is made of a magnetic material.

Preferably, in a solar cell module according to the invention, said information carrying body has regions with respective sound reflectivities that are different from each other.

Preferably, in a solar cell module according to the invention, said information carrying body has regions with respective infrared reflectivities that are different from each other.

Preferably, in a solar cell module according to the invention, said information carrying body has a photosensitive color transitivity responsive to ultraviolet rays.

Preferably, in a solar cell module according to the invention, said information carrying body has a thermally sensitive color transitivity.

Preferably, in a solar cell module according to the invention, said information carrying body has a hue similar to that of the surrounding area.

Preferably, in a solar cell module according to the invention, said information carrying body is transparent in the visible range.

A solar cell module according to the invention provides the following advantages.

Firstly, since the information carrying body is invisible, it can be arranged on the light receiving surface of a solar cell module to store necessary information without taking away from the appearance of the solar cell module.

Secondly, since the information carrying body can be made to have at least a region different from the remaining areas of the solar cell module in terms of magnetism, sound reflectivity, infrared reflectivity, photosensitive color transitivity and/or thermally sensitive color transitivity, it can be arranged invisibly, and information can be stored on and retrieved from it.

Thirdly, since the information carrying body can be made to have a hue similar to that of the surrounding area, it can be made invisible.

Additionally, since the information can be made transparent, it can be made invisible and arranged on the photovoltaic region of the solar cell module without reducing the photovoltaic effect of the solar cell module. In other words, it is no longer necessary to limit the area to be occupied by the information carrying body so that it can be made to store a large volume of information. Still additionally, since it is no longer necessary to spare an area on the solar cell module for arranging the information carrying body, the ratio of the area dedicated to the photovoltaic effect relative to the entire area of the light receiving surface can be raised.

Still additionally, each individual solar cell module can be identified by displaying its control number on the light receiving surface thereof so that a solar cell module array can be installed on site as designed optimally at the time of shipment.

Furthermore, if some of the solar cell modules of a solar cell module array are damaged on the surface, optimal replacement solar cell modules can be selected by reading the I-V curve data stored on the information carrying bodies of the spare solar cell modules stored on site to optimally design the new solar cell module array. Such an optimal design can be realized without difficulty for the new solar cell module array by using an array designing program that can be stored in a portable personal computer.

Finally, if it is necessary to replace the solar cell modules damaged by foreign objects that have collided with the surface of the solar cell modules, the type of solar cell modules and of connectors used for the modules can be identified without dismantling the roof carrying the solar cell modules thereon because their information carrying bodies are arranged on the light receiving surface. Then, replacement solar cell modules can be brought in and the replacing operation can be performed highly efficiently.

BRIEF DESCRIPTION OF THE DRAWINGS

FIGS. 4A and 4B are schematic views of a known solar cell module, of which FIG. 4A is a perspective view and FIG. 4B is a cross sectional view taken along line 4B—4B in FIG. 4A.

DESCRIPTION OF THE PREFERRED EMBODIMENTS

Now, the present invention will be described in greater detail by referring to the accompanying drawings that illustrate preferred embodiments of the invention. The information carrying body for the purpose of the present invention is invisibly arranged, i.e., carried information cannot be seen by the eyes. Specifically, the information carrying body is constituted by a material which cannot be discriminated at wavelengths of, e.g., 400 nm to 700 nm.

Figure 1:
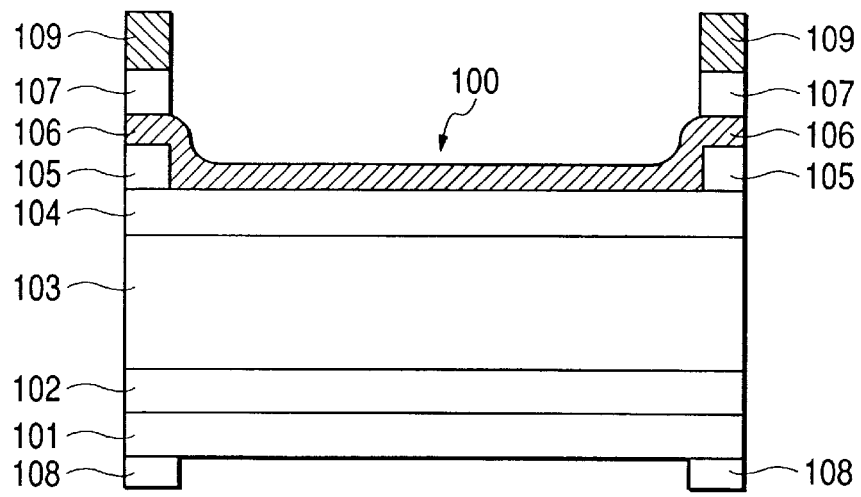
FIG. 1 is a schematic cross sectional view of a photovoltaic element that can be used in a solar cell module according to the invention.

FIG. 1 is a schematic cross sectional view of a photovoltaic element that can be used for a solar cell module according to the invention.

Referring to FIG. 1, a photovoltaic element 100 that can be used for a solar cell module according to the invention comprises a rear surface reflection layer 102, a semiconductor photoactive layer 103, a transparent electrode 104, an insulation layer 105, a collector electrode 106 and a positive bus bar electrode 107 formed sequentially on a flexible substrate 101 in the above-described order, an insulation member 109 being additionally arranged on the positive bus bar electrode 107, in addition to a negative bus bar electrode 108 arranged on the rear surface side of the flexible substrate 101.

Now, each of the above members will be described in detail.

(Flexible Substrate)

The flexible substrate 101 operates as a base member of the solar cell module 100 and also as a lower electrode. It is typically made of a material selected from stainless steel, aluminum, copper, resin film or ceramic having an electroconductive layer and the like.

(Rear Surface Reflection Layer)

The rear surface reflection layer 102 may be made to comprise a metal layer or a metal oxide layer. Materials that can be used for the metal layer include Al, Ag and Ni, whereas materials that can be used for the metal oxide layer include ZnO, $TiO_2$ and $SnO_2$.

(Photoactive Layer)

The semiconductor photoactive layer 103 is responsible for photoelectric conversion. Materials that can be used for the layer include pn-junction type polycrystalline silicon, pin-junction type amorphous silicon and compound semiconductor materials.

(Transparent Electrode)

The transparent electrode 104 operates as an upper electrode of the solar cell. Materials that can be used for the transparent electrode 104 include $In_2O_3$, $SnO_2$, $In_2O_3$—$SnO_2$ (ITO) and ZnO.

(Insulation Layer)

The insulation layer 105 is realized by arranging an adhesive layer on each of the opposite sides of an insulating resin film base member. The insulating resin film base member operates for protecting the photovoltaic element 100 against heat of hot solder and a burred and/or broken positive bus bar electrode 107. Materials that can be used for the insulation layer 105 include triacetate cellulose, polyethyleneterephthalate, polyetherketone, fluororesin, polysulfone, polyamide, polyimide and polyimideamide.

The adhesive agent that can be used for the purpose of the invention may be an acrylic type, a rubber type, a silicone type or a polyvinyl ether type.

(Collector Electrode)

A collector electrode 106 is arranged on the transparent electrode 104 in order to efficiently collect electricity. The collector electrode 106 is formed by coating a metal wire typically made of Al, Ag, Au, Ni, Cu, Sn or Pt with paste obtained by diffusing electroconductive particles and a binding agent.

(Positive Bus Bar Electrode, Negative Bus Bar Electrode)

The positive bus bar Electrode 107 and the negative bus bar electrode 108 are made of a metal or an alloy with low electric resistance. Examples of materials that can be used for the bus bar electrodes include metals such as Cu, Ag, Au, Pt, Al, Sn, Pb and Ni and alloys of thereof. The bus bar electrodes 107, 108 are made to appear as a foil strip or a wire.

An information carrying body as described in greater detail hereinafter may be arranged on the front surface of the positive bus bar electrode 107.

(Insulation Member)

The insulation member 109 is typically made of polyethyleneterephthalate, fluororesin, polyamide or polyimide.

An adhesive agent may be used to preliminarily secure the insulation member 109 on the positive bus bar electrode 107. The adhesive agent may be an acrylic type, a rubber type, a silicone type or a polyvinylether type. Particularly, the use of an adhesive agent of an acrylic type or a silicone type is advantageous for the purpose of the invention from the viewpoint of thermal resistance, moisture resistance and coercive force.

The insulation member 109 may be used as mask for making the metallic gloss of the positive bus bar electrode 107 unrecognizable from the light receiving surface side of the solar cell module. If such is the case, the insulation member 109 preferably shows a color similar to that of the photovoltaic elements 100 or that of the flexible substrate 101.

As described hereinafter, the information carrying body may be arranged on the surface of the insulation member 109.

(Information Carrying Body)

Now, a method of detecting an information carrying body, materials that can be used for an information carrying body and a method of arranging an information carrying body will be described in detail below. For the purpose of the invention, an information carrying body to be arranged on a solar cell module according to the invention is different from any conventional recording medium such as a name plate for displaying information in that the information stored therein in an integrated manner can be read out only when an external stimulus is applied to it. A solar cell module according to the invention is provided with an information carrying body that is arranged invisibly on the light receiving surface of the module.

(1) Information Carrying Body Containing a Magnetic Material

An information carrying body containing a magnetic material is provided so that it can be detected by a magnetic head. It can be arranged suitably by depositing the magnetic material directly on a member of a solar cell module by evaporation, or alternatively, by bonding by means of a resin the magnetic material onto the base member at an appropriate position, such as with magnetic tape.

When an information carrying body containing a magnetic material is used, the magnetic material may be oriented in a known manner so that necessary information may be stored in and retrieved from it. Alternatively, characters and other symbols may be printed on a desired position of the substrate of a solar cell module by means of toner or ink to which an appropriate magnetic material is added.

Toner that can be used for the purpose of the invention typically contains a magnetic material and a binder resin to which a pigment or a dye is added if necessary. On the other hand, ink that can be used for the purpose of the invention contains a magnetic material, a binder resin and a solvent to which a pigment or a dye is added if necessary.

Information may be written into and read from such an information carrying body by means of a known magnetic head.

For the purpose of the invention, an information carrying body is realized by using appropriate materials selected from those listed below and arranging it in a manner as described below.

Magnetic materials that can be used for an information carrying body for the purpose of the invention include metals such as iron and cobalt or alloys thereof, metal oxides such as iron oxide, ferrites such as Mn—Zn ferrite and Ni—Zn ferrite, magnetite and hematite. The surface of particles of a magnetic material as described above may be treated with silane or a titanium type coupling agent in order to encourage the diffusion of the magnetic material in the resin, as described below.

Polyester, styrene, styrene-acryl, polymethylmethacrylate, polyvinylacetate or epoxy can be used for the resin to which the magnetic material is added and for the binder resin to be used in toner or ink for the purpose of the invention. Any of these resin materials may be used independently or in combination.

In order to avoid the degradation and subsequent coloration of the arranged information carrying body due to irradiated light, heat and/or moisture, agents such as an ultraviolet absorbing agent and/or an antioxidant is preferably added to the base member of the information carrying body and the resin of the binder.

The base member of an information carrying body to be used for a solar cell module according to the invention is preferably made of polymer film that shows a high degree of weatherability and thermal resistance. Materials that can be used for the base member of the information carrying body include polyethyleneterephthalate, polyethylenenaphthalate, polyimide and polyetherimide.

Ink that can suitably be used for the purpose of the invention is that of a solvent type because it dries quickly. Examples of such solvents include acetone, toluene, xylene, isopropylalcohol, carbitol, ethylacetate and methylethylketone.

For an information carrying body to be arranged invisibly, it is necessary to select a hue for the base member of the information carrying body that is the same as that of the surrounding area. The hue of the base member can be regulated by adding a desired pigment or dye to the resin and the toner or ink to which the magnetic material is added.

For arranging an information carrying body on the photovoltaic region of a solar cell module, the toner or the ink to be used is preferably transparent. If such is the case, a YIG based rare earth type compound, ferromagnetic ferrite or monocrystalline or polycrystalline semiconductor of yttrium-gallium-garnet can be used as the magnetic material for purposes of the invention.

For the information stored on the information carrying body to be read correctly, preferably the gap separating the information carrying body and the magnetic head for reading the information is minimized, and the information carrying body is not affected by magnetism if metal is used for the rear surface members. Additionally, it is desirable that the information carrying body is arranged inside the solar cell module because, otherwise, the information carrying body can be peeled off from the solar cell module as it is beaten by rain and sand in bad weather.

The information carrying body is preferably arranged by printing on the front surface sealing member side of the front surface member or between the front surface member and the front surface sealing member.

While information may be recorded in the information carrying body in a desired manufacturing step, the operation of storing information in the information carrying body is preferably conducted at the end of the laminating process to minimize the influence of heat and store the information that can be obtained in the finishing step including the I-V curve data and the type of the connector/cable of the solar cell module.

(2) Information Carrying Body Having a Region Different from the Remaining Areas of the Solar Cell Module in Terms of Sound Reflectivity An information carrying body can be produced by arranging a material different from the remaining areas of the solar cell module in terms of sound reflectivity at a desired position of the module. Generally, the presence of such an information carrying body is detected by means of an ultrasonic wave. An ultrasonic wave is characterized by how it is reflected, absorbed or scattered by an interface of two different densities or two different moduli of elasticity. Therefore, the information stored in a solar cell module can be retrieved from the sound pattern produced from the module by utilizing this characteristic property of an ultrasonic wave.

Any known device that can emit an ultrasonic wave between 1 and 100 MHz can be used as an ultrasonic source for the purpose of the invention. Similarly, a known ultrasonic sensor can be used to detect the information carrying body by arranging water or an appropriate jelly-like liquid on the information carrying body.

An information carrying body may be arranged on a solar cell module by printing invisible characters and other symbols in an appropriate area of the front surface member, the rear surface insulation member or the rear surface member, using toner or ink to which an inorganic filler material such as glass beads or an inorganic pigment is added. Alternatively, an information carrying body may be produced by evaporating metal or metal oxide or by printing information using toner or ink to which metal or metal oxide is added. Metals and metal oxides that can be used advantageously for the purposes of the invention include aluminum, tin, zinc, copper, indium and oxides of these metals.

While the information carrying body may be arranged at a desired position on the light receiving surface side of a solar cell module, it is desirable that the information carrying body is arranged inside the solar cell module because, otherwise, the information carrying body can be peeled off from the solar cell module or otherwise damaged as it is beaten by rain and sand in bad weather.

(3) Information Carrying Body Having a Region Different from the Remaining Areas of the Solar Cell Module in Terms of Infrared Reflectivity An information carrying body can be invisibly formed by arranging a material different from the remaining areas of the solar cell module in terms of infrared reflectivity at a desired position of the module. Then, the information can be retrieved by irradiating the information carrying body and the surrounding area with infrared rays and utilizing the difference of infrared reflectivity between them.

More specifically, infrared rays that can hardly be absorbed or reflected or found in a near infrared zone will be used to irradiate the information carrying body and the surrounding area, and the information is retrieved through the difference of reflectivity between them. A device adapted to emit infrared rays with a wavelength between 0.8 and 25 $\mu$m will be used as infrared source. The information carrying body can be detected by means of a known detector comprising an infrared sensor.

Materials that can be used for the information carrying body include metal oxides such as silicon oxide, tin oxide, indium oxide, titanium oxide and zirconium oxide.

An information carrying body can be arranged by evaporating metal oxide or by printing information using an appropriate toner or ink to which metal oxide is added.

While the information carrying body may be arranged at a desired position on the light receiving surface side of a solar cell module, it is desirable that the information carrying body is arranged inside the solar cell module because, otherwise, the information carrying body can be peeled off from the solar cell module or otherwise damaged as it is beaten by rain and sand in bad weather.

(4) Information Carrying Body Showing Photosensitive Color Transitivity Relative to Ultraviolet Rays An information carrying body can be invisibly formed by arranging a material different from the remaining areas of the solar cell module in terms of photosensitive color transitivity. Then, the information can be retrieved by irradiating the information carrying body and the surrounding area with ultraviolet rays and changing the color of the information carrying body.

A device adapted to emit ultraviolet rays with a wavelength between 200 and 400 nm will be used as ultraviolet source. The information carrying body can be detected by means of a known CCD or vacuum photoamplifier tube.

Color transitive materials that can be used for the information carrying body include fluorescent bodies such as anthracene, diaminostilbene and fluoresceine and photochromic materials such as azobenzene, flugide and spiropyran.

An information carrying body can be arranged by printing information at a desired position of the light receiving surface of the solar cell module, using toner or ink to which a fluorescent body or a photochromic material is added. The information carrying body is preferably arranged on the front surface member because the front surface sealing member may contain an ultraviolet absorbing agent.

While the information carrying body may be arranged at a desired position on the light receiving surface side of a solar cell module, it is desirable that the information carrying body is arranged inside the solar cell module because, otherwise, the information carrying body can be peeled off from the solar cell module or otherwise damaged as it is beaten by rain and sand in bad weather.

(5) Information Carrying Body Showing Temperature Sensitive Color Transitivity

An information carrying body can be invisibly formed by arranging a material which is invisible at ambient temperature or room temperature but different from the remaining areas of the solar cell module in terms of thermally sensitive color transitivity. Then, the information can be retrieved by heating the information carrying body and the surrounding area and changing the color of the information carrying body.

An information carrying body adapted to such a mode of identification is transparent or shows a hue similar to that of the surrounding area, but changes its color when heated so that it can be detected typically by means of a photodetector because of the produced color difference.

Such an information carrying body can be produced by using a known thermochromic material. More specifically, an information carrying body can be arranged by printing information at a desired position on the light receiving surface of the solar cell module, using toner or ink to which a thermochromic material is added.

While the information carrying body may be arranged at a desired position on the side of the light receiving surface of a solar cell module, it is desirable that the information carrying body is arranged inside the solar cell module because, otherwise, the information carrying body can be peeled off from the solar cell module or otherwise damaged as it is beaten by rain and sand in bad weather.

(6) Information Carrying Body Showing a Hue Similar to that of the Surrounding Area, Information Carrying Body Transparent in a Visible Area.

For the purposes of the invention, an information carrying body may be arranged at any place on the light receiving surface of the solar cell module. However, the information carrying body should show a hue similar to that of the surrounding area or should be transparent.

In order to make the information carrying body show a hue similar to that of the surrounding area, a desired pigment or dye may be added to the toner or ink to be used for forming the information carrying body. Note that the front surface sealing member and the rear surface sealing member will be molten during the lamination process to alter the profile of the information carrying body produced by evaporation or printing so that the latter may no longer be identified properly. Therefore, if the information carrying body is formed by evaporation or printing, it is preferably arranged on the front surface member, the photovoltaic element, the rear surface insulating body or the rear surface member.

Alternatively, the information carrying body may be formed on a separate member by means of the above described technique, and the separate member may be arranged between any two members of the laminate. However, such a separate member should be carrying a hue similar to the area surrounding the information carrying body or transparent and show a high degree of weatherability. Specific materials that can be used for such a separate member include polyethyleneterephthalate, fluorine resin film and silicone resin film. The surface of the separate member that is to be printed is preferably subjected to a corona treatment, a plasma treatment or a treatment for improving the ink adhesion.

Since the information carrying body is invisible, the operators on site may have difficulty in locating the information carrying body when it is displaced from the predetermined proper position for some reason or other. Therefore, an adhesive agent may be applied to the separate member and temporarily secured to the predetermined position.

In order for the information carrying body to be arranged at any position on the light receiving surface of the solar cell module, the adhesive agent is also required to show a high degree of weatherability. Preferably, a silicone type adhesive agent is used.

The information to be stored on the information carrying body refers to the information produced prior to the time of arranging the solar cell module on a roof. Particularly, it refers to the information that can be collected when the solar cell module is manufactured.

More specifically, the information may include the type of solar cell module 100, the type of photovoltaic element 101, the rated values, the control numbers, the date of manufacture, the plant of manufacture, the manufacturer, the manufacturing conditions, the destination of shipment, the components and the types of the components of the solar cell module as well as the electric characteristics of the photovoltaic element.

Then, by selecting an information carrying body as described in any of (1) through (6) above, it can be invisibly arranged without damaging the appearance of the solar cell module. Since the information carrying body is invisible, the operators trying to find the information carried on the body may experience difficulty in locating the information carrying body. However, such difficulty can be avoided by defining the location of the information carrying body in advance, although it may not be detected by a third party with ease.

Figure 2:
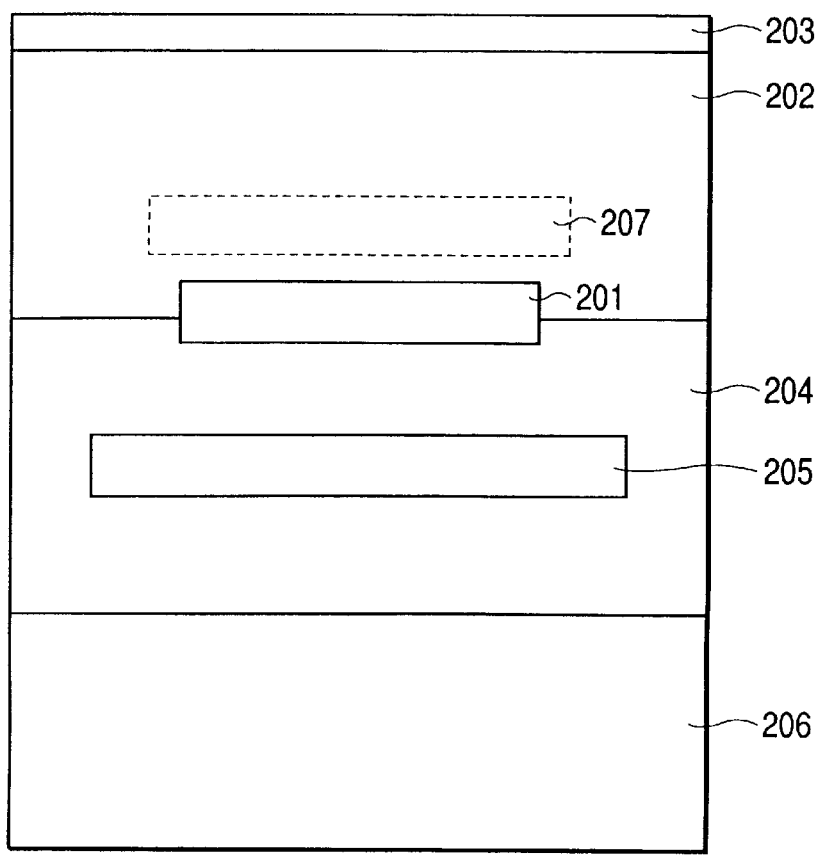
FIG. 2 is a schematic illustration of a coating member that can be used for a solar cell module according to the invention.

Now, a coat used for a solar cell module according to the invention will be described by referring to FIG. 2.

In a solar cell module according to the invention, the group of photovoltaic elements and the surrounding area are covered by a coat. The coat comprises a front surface sealing member 202, a front surface member 203, a rear surface sealing member 204, a rear surface insulation member 205, a rear surface member 206 and a front surface protecting/reinforcing member 207. The group of photovoltaic elements 201 comprises a plurality of photovoltaic elements 100 described earlier by referring to FIG. 1.

(Front Surface Sealing Member)

The front surface sealing member 202 is an indispensable member that covers and fills the undulations formed by the group of photovoltaic elements 201 and protects the group of photovoltaic elements 201 against temperature changes and the external environment that can apply moisture and severely impact them. It is also necessary to firmly bond the front surface member 203 and the group of photovoltaic elements 201.

Thus, the front surface sealing member 202 is required to exhibit an enhanced degree of weatherability, adhesiveness, filling effect, thermal resistance, cold resistance and impact resistance. Resin materials that can meet these requirements include polyolefin resin such as ethylene-vinylacetate copolymer (EVA), ethylene-methylacrylate copolymer (EMA), ethylene-ethylacrylate copolymer (EEA) and butyral resin, urethane resin, and silicone resin.

(Front Surface Member)

The front surface member 203 is required to exhibit a high degree of weatherability, contamination resistance, mechanical strength and reliability for a long period of time as the solar cell module remains outdoors and exposed to ambient air.

The front surface member 203 of a solar cell module according to the invention may be made of fluororesin, acryl resin or a glass substrate. Specific materials that can be used for the front surface member 203 include polyvinylidene fluoride, polyvinyl fluoride and ethylene-ethylene tetrafluoride copolymer.

(Rear Surface Insulation Member)

The rear surface insulation member 205 is necessary for keeping the electric insulation of the group of photovoltaic elements 201 relative to the outside. It is required to be made of a material that exhibits an enhanced degree of electric insulation, durability and resistance against thermal expansion and thermal contraction as well as flexibility. Materials that can suitably be used for the rear surface insulation member include nylon, polyethyleneterephthalate and polycarbonate.

(Rear Surface Sealing Member)

The rear surface sealing member 204 is used to bond the group of photovoltaic elements 201 and the rear surface insulation member 205. Materials that can suitably be used for the rear surface sealing member include thermoplastic resins such as ethylene-vinylacetate copolymer (EVA), ethylene-methylacrylate copolymer (EMA), ethylene-ethylacrylate copolymer (EEA), polyethylene and polyvinylbutyral, a double sticky tape and a soft epoxy bonding agent.

(Rear Surface Member)

The rear surface member 206 is applied to the rear surface of the solar cell module in order to improve the mechanical strength of the solar cell module and/or prevent distortions and warping due to temperature change. It is also used to make the solar cell module integral with the roof where the module is placed. Preferable materials to be used for the rear surface member include a galvanized iron sheet coated with a resin having excellent weatherability and anticorrosive properties, a plastic panel and a glass fiber reinforced plastic panel.

(Front Surface Protecting/Reinforcing Member)

Materials that can be used for the front surface protecting/reinforcing member 207 include glass fiber unwoven fabric, glass fiber woven fabric and glass filler, of which glass fiber unwoven fabric is preferable.

(Lamination)

Now, the process of lamination for coating the groups of photovoltaic elements 201 with the above members will be described.

For coating the group of photovoltaic elements 201, the rear surface member 206, the rear surface sealing member 204, the rear surface insulation member 205 and the group of photovoltaic elements 201 are sequentially laid on the plate of a single vacuum type laminating machine with the light receiving side facing upward, and then the front surface protecting/reinforcing member 207, the front surface sealing member 202 and the front surface member 203 are sequentially laid to produce a laminate.

Then, a teflon-coated fiber sheet (0.2 mm thick) and a silicone rubber sheet (2 mm thick) are laid thereon. Then, the inside of the laminate is evacuated for 30 minutes to 2.1 Torr by means of a vacuum pump.

The laminate evacuated by a vacuum pump is put into an oven that has been heated to 160° C. in advance and held to that temperature for 50 minutes before it is taken out and cooled in order to sufficiently promote the bridging reaction that proceeds during the bonding process under pressure.

Figure 4A:
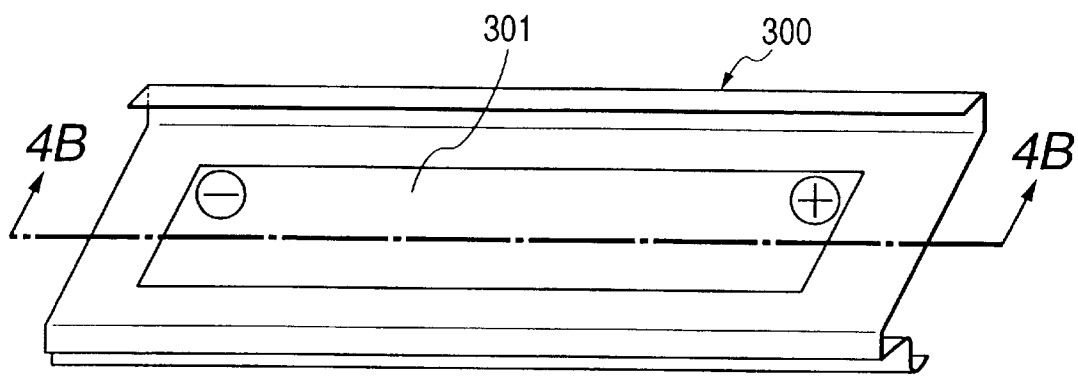
Figure 4B:
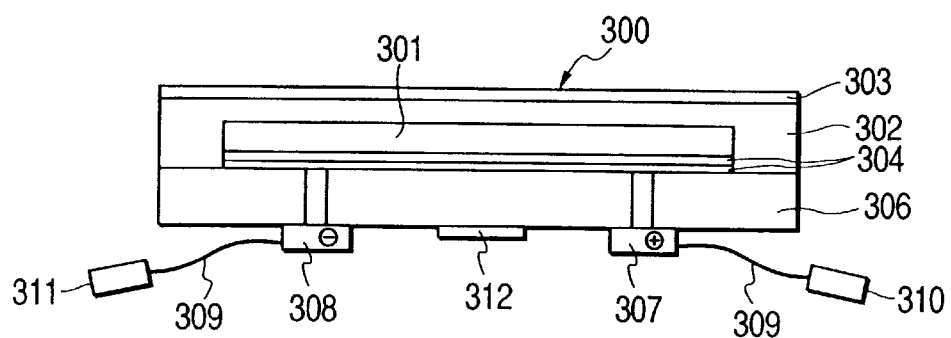

The electric output of the solar cell module can be drawn out as with any conventional solar cell module. More specifically, electricity generated by the photovoltaic elements can be drawn out through the holes bored through the rear surface member 306 and by ay of the terminal boxes 307, 308 and the wires 309 provided with connectors 310, 311 as shown in FIG. 4B.

A solar cell module according to the invention may be provided with a storage medium adapted to electronically or magnetically store information in addition to the information carrying body invisibly arranged on the light receiving surface.

It should be noted, however, such a storage medium is different from a storage medium for simply storing information in the form of characters and/or other symbols such as a name plate as described earlier.

Figure 3A:
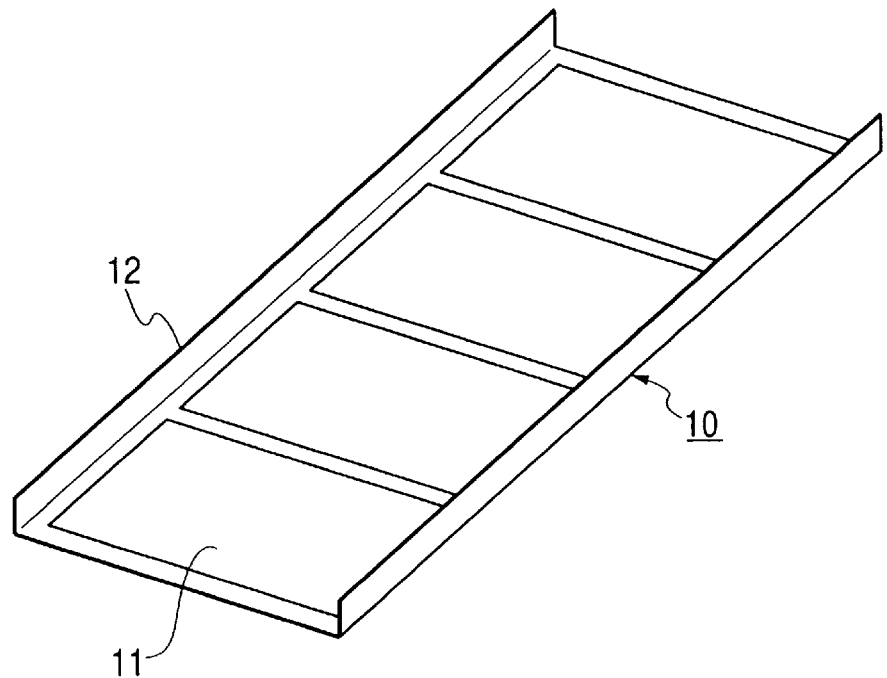
FIGS. 3A and 3B are schematic perspective views of a solar cell module according to the invention.
Figure 3B:
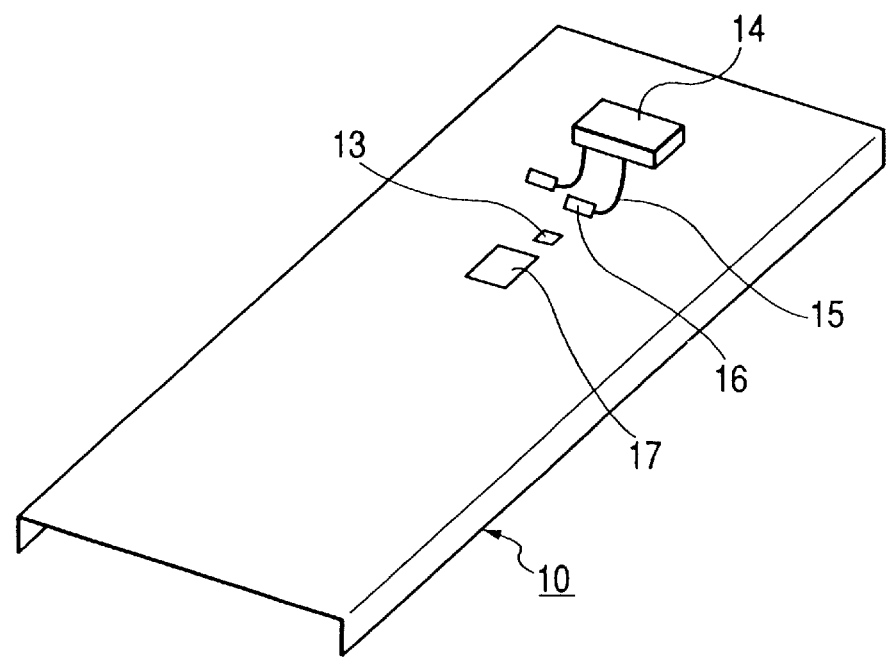

FIGS. 3A and 3B show schematic perspective views of a solar cell module according to the invention. FIG. 3A shows the light receiving surface of the solar cell module, while FIG. 3B shows the rear surface of the solar cell module.

Referring to FIGS. 3A and 3B, the solar cell module 10 comprises a photovoltaic element section 11 that operates for photoelectric conversion and a support panel 12 for supporting the photovoltaic element section 11.

The side of the support panel 12 that receives the photovoltaic element section 11 is the light receiving surface of the solar cell module.

The solar cell module 10 further comprises a name plate 17 arranged on the surface opposite to the light receiving surface, an output means for feeding the electricity generated by the photovoltaic element section 11 to the outside and a storage medium 13 for storing information.

The output means and the storage medium 13 are arranged on the rear surface of the solar cell module 10 that is not exposed to sun beams and hence high temperature.

The output means comprises a terminal box 14, wires 15 and connectors 16, and the solar cell module 10 can be connected to another solar cell module or some other power collecting means (not shown) by way of the connectors 16 in order to output the generated power from the solar cell module 10.

Thus, the solar cell module 10 comprising a storage medium 13 can store information by a volume much greater than the volume of information that can be stored in the information carrying body.

The storage medium 13 is a non-volatile storage medium from which no data will be erased unless a special instruction is given to it to erase any of the data it stores and operates as means for storing information in an invisible form. More specifically, the non-volatile storage medium is typically a semiconductor memory.

The information stored in such a storage medium 13 is the information obtained before the solar cell module is arranged on the roof and may include the type of the solar cell module 10, the type of photovoltaic element section 11, the rated values, the control numbers, the date of manufacture, the plant of manufacture, the manufacturer, the manufacturing conditions, the destination of shipment, the components and the types of the components of the solar cell module as well as the electric characteristics of the photovoltaic element.

The storage medium 13 also stores information that is otherwise stored on the name plate of a conventional solar cell module, the log book and/or the data base of a computer.

Such information will be stored in the storage medium 13 by means of a writing means (not shown) before the solar cell module 10 is mounted on a roof. After the installation of the solar cell module, any part of the large volume of information stored in the storage medium may be read out by means of a reading means (not shown).

Thus, a solar cell module according to this embodiment of the invention can store a large volume of information in an integrated manner in addition to the information stored on the name plate of the module. The volume of information that can be stored in the solar cell module is comparable to that of a log book or the data base of a computer. The information can then be read out directly from the storage medium.

Additionally, since the non-volatile storage medium 13 is arranged on the side opposite to the light receiving surface of the solar cell module, it does not block the light striking the light receiving surface, and hence it does not reduce the photovoltaic effect of the solar cell module.

As described above, the storage medium 13 of the solar cell module is arranged on the side opposite to the light receiving surface of the solar cell module 10 so that the non-volatile storage medium can reliably store information if it is a semiconductor memory that is poorly heat-resistant. This is done because the side opposite to the light receiving surface is least subject to temperature rise, although the temperature of the light receiving surface can rise remarkably during the day time when it is irradiated with sun beams.

The input/output means of a solar cell module according to this embodiment of the invention may be arranged either on the light receiving surface or the side opposite to it. If the input/output means is arranged on the light receiving surface of the solar cell module, the information stored in the storage medium can be read out, and additional information can be written into it from outside without dismantling, if partly, the roof on which the solar cell module is installed even when the information is necessary for the purpose of maintenance. An optical, magnetic, electrostatic or electric telecommunication means may be used to communicate with the storage medium by way of the input/output means. If the input/output means is arranged on the light receiving surface of the solar cell module, an optical, magnetic, electrostatic or electric telecommunication means may be used to communicate with the storage medium without dismantling the system.

Now, a solar cell module according to the invention will be described further by way of examples.

EXAMPLE 1

A solar cell module was prepared in a manner as described below for this example.

(Preparation of Collector Electrodes)

For the metal wire of each collector electrode, a 100 mmφ copper wire was used, and electroconductive resin was prepared in the following way.

A mixed solvent containing 2.5 g of ethyl acetate and 2.5 g of isopropyl alcohol was put into a dispersive shaking bottle. Then, 22.0 g of urethane resin was added to the shaking bottle as principal agent and agitated thoroughly by means of a ball mill. Then, 1.1 g of block isocyanate and 10 g of dispersant glass beads (1 mmφ) were added to the above solution. Thereafter, 2.5 g of carbon black with an average primary particle diameter of 0.05 $\mu$m was added to the above solution as electroconductive particles. Then, the shaking bottle containing the above substances was shaken by means of a paint shaker for 10 hours, and the dispersant glass beads were removed from the produced paste.

Subsequently, the copper wire was coated with the above electroconductive resin by means of a wire coating machine. In the coating process, a copper wire feed reel was placed in position, and the copper wire was pulled toward a take-up reel under tension, while the electroconductive resin was poured into the coater. Thus, the copper wire was coated with the resin as it is taken up by the take-up reel.

(Preparation of a Semiconductor Layer)

An Al layer (5,000 Å thick) and a ZnO layer (5,000 Å thick) were formed sequentially as a rear surface reflection layer on a cleaned stainless steel substrate by sputtering. Then, an n-type a-Si layer, an i-type a-Si layer and a p-type microcrystalline $\mu$c-Si layer were formed by plasma CVD, respectively, from a gaseous mixture of $SiH_4$, $PH_3$ and $H_2$, a gaseous mixture of $SiH_4$ and $H_2$ and a gaseous mixture of $SiH_4$, $BF_3$ and $H_2$ to produce a tandem type a-Si photoelectric conversion semiconductor multilayer comprising a 150 Å thick n-layer, a 4,000 Å thick i-layer, a 100 Å thick p-layer, a 100 Å thick n-layer, an 800 Å thick i-layer, and a 100 Å thick p-layer.

Then, an $In_2O_3$ thin film (700 Å thick) was formed as a transparent electroconductive layer by evaporating In in an $O_2$ atmosphere by means of a resistance heating technique.

(Preparation of Photovoltaic Elements)

Photovoltaic elements were prepared in the following way.

(1) The transparent electrode was partly removed from the light receiving surface of the semiconductor layer with a surface area of 356 mm×239 mm by means of etching paste containing ferric chloride as the principal ingredient and a commercially available printing machine until the photovoltaic region takes a surface area of 800 $cm^2$, so that a photovoltaic region and a non-photovoltaic region were formed on the light receiving surface.

(2) Then, a 100 $\mu$m thick hard copper layer was bonded to the rear surface of the semiconductor layer as negative bus bar electrode by laser welding.

(3) An insulation layer (50 $\mu$m thick/25 $\mu$m thick polyimide/25 $\mu$m thick silicone adhesive/75 $\mu$m thick polyethyleneterephthalate/50 $\mu$m thick silicone adhesive) was bonded to the non-photovoltaic region in such a way that the polyimide is arranged in the non-photovoltaic region on the light receiving surface.

(4) The collector electrodes were arranged with a distance of 5.5 mm separating them and secured to the insulation layer at the ends thereof.

(5) A piece of silver-plated hard copper (100 $\mu$m thick and 5.5 mm wide) was arranged on the collector electrodes and the bonding member as a positive bus bar electrode.

(6) One of the collector electrodes and the transparent electrode were heated to 200° C. under pressure of 1 kg/$cm^2$ for 1 minute in order to bond them together.

(7) The other collector electrode and the positive bus bar electrode were heated to 200° C. under pressure of 5 kg/$cm^2$ for 15 seconds on the positive bus bar electrode in order to bond them together. Thus, desired photovoltaic elements were obtained.

(8) A 100 $\mu$m thick black polyethyleneterephthalate layer and a 30 $\mu$m thick acryl adhesive agent layer were formed as the insulation member on the positive bus bar electrode.

(Formation of an Information Carrying Body)

A magnetic paint (transparent ferromagnetic material: 100 weight portions, saponified ethylene-vinylacetate copolymer: 8 weight portions, polyurethane resin: 8 weight portions, MIBK: 91 weight portions, toluene: 91 weight portions, cyclohexanone: 91 weight portions) was applied to the front surface sealing member side of the front surface member to a thickness of 1 $\mu$m to produce an information carrying body.

(Lamination)

For coating the group of photovoltaic elements, the rear surface member, the rear surface sealing member, the rear surface insulation member, the rear surface sealing member and the group of photovoltaic elements were sequentially laid on the plate of a single vacuum type laminating machine with the light receiving side facing upward, and then the front surface protecting/reinforcing member, the front surface sealing member and the front surface member were sequentially laid to produce a laminate. Then, a teflon-coated fiber sheet (0.2 mm thick) and a silicone rubber sheet (2.3 mm thick) were laid thereon. Then, the inside of the laminate was evacuated for 30 minutes to 2.1 Torr by means of a vacuum pump.

The laminate evacuated by a vacuum pump was put into an oven that has been heated to 160° C. in advance and held to that temperature for 50 minutes before it was taken out and cooled, in order to sufficiently promote the bridging reaction that proceeds during the bonding process under pressure.

(Storing Information in the Information Carrying Body)

Information was stored as digital signals in the magnetic tape in the solar cell module prepared in an above described procedure by means of a magnetic head.

(Reading Information from the Information Carrying Body)

The information stored in the information carrying body was read out by means of a magnetic head.

EXAMPLE 2

In this example, the procedure of Example 1 was followed to prepare a solar cell module except that the arrangement of the information carrying body was modified in a manner as described below.

In the solar cell module of Example 2, an information carrying body was prepared by printing a bar code pattern as information to be stored on it by means of solvent type ink (containing silicon oxide as additive: 5 weight portions, epoxy resin as binder: 100 weight portions) on the group of photovoltaic elements arranged on the front surface sealing member side of the front surface member before preparing a laminate.

(Reading Information from the Information Carrying Body)

Water drops were placed on the information carrying body. Then, an ultrasonic wave with a frequency of 50 MHz was applied to it, and the reflected sound was detected by an ultrasonic sensor to read the bar code pattern of the information carrying body.

EXAMPLE 3

In this example, the procedure of Example 1 was followed to prepare a solar cell module except that the arrangement of the information carrying body was modified in a manner as described below.

In the solar cell module of Example 3, an information carrying body was prepared by printing a bar code pattern as information to be stored on it by means of solvent type ink (containing titanium oxide as additive: 5 weight portions, epoxy resin as binder: 100 weight portions, xylene as solvent: 300 weight portions) in a region of the light receiving surface side of the rear surface member where the group of photovoltaic elements are not arranged before preparing a laminate.

(Reading Information from the Information Carrying Body)

The information carrying body was irradiated with a monochromatic beam of carbon oxide laser with a wavelength of 10.6 $\mu$m and the reflected beam was detected by an infrared sensor to read the bar code pattern of the information carrying body.

EXAMPLE 4

In this example, the procedure of Example 1 was followed to prepare a solar cell module except that the arrangement of the information carrying body was modified in a manner as described below.

In the solar cell module of Example 4, an information carrying body was prepared by printing a bar code pattern as information to be stored on it by means of a paint (containing anthracene as additive: 0.1 weight portions, polyester resin as binder: 100 weight portion) on the front surface sealing member side of the front surface member at a position right above the photovoltaic elements or on the light receiving surface side before preparing a laminate.

(Reading Information from the Information Carrying Body)

The information carrying body was irradiated with light from a metal halide lamp from which wavelengths above 380 nm were completely eliminated by means of a color filter, and fluorescence of 400 nm was detected by means of a CCD to read the bar code pattern of the information carrying body.

In each of above Examples 1 through 4, an information carrying body was invisibly arranged on the light receiving surface of the solar cell module, and the necessary information could be retrieved from the information carrying body.

What is claimed is:

1. A solar cell module, having an information carrying body invisibly arranged on the side of the light receiving surface of the solar cell module and carrying information about the solar cell module.

2. A solar cell module according to claim 1, wherein said information carrying body is made of a magnetic material.

3. A solar cell module according to claim 1, wherein said information carrying body has regions with respective sound reflectivities that are different from each other.

4. A solar cell module according to claim 1, wherein said information carrying body has regions with respective infrared reflectivities that are different from each other.

5. A solar cell module according to claim 1, wherein said information carrying body has a photosensitive color transitivity responsive to ultraviolet rays.

6. A solar cell module according to claim 1, wherein said information carrying body has a thermally sensitive color transitivity.

7. A solar cell module according to claim 1, wherein said information carrying body has a hue similar to that of the surrounding area.

8. A solar cell module according to claim 1, wherein said information carrying body is transparent in the visible region.

9. A solar cell module according to claim 1, wherein the information carried in the information carrying body is invisible at wavelengths of 400 nm to 700 nm.

10. A method of manufacturing a solar cell module, comprising a step of invisibly arranging an information carrying body carrying information about the solar cell module on the side of the light receiving surface of the solar cell.

11. A method of manufacturing a solar cell module according to claim 10, wherein said information carrying body is made of a magnetic material.

12. A method of manufacturing a solar cell module according to claim 10, wherein said information carrying body has regions with respective sound reflectivities that are different from each other.

13. A method of manufacturing a solar cell module according to claim 10, wherein said information carrying body has regions with respective infrared reflectivities that are different from each other.

14. A method of manufacturing a solar cell module according to claim 10, wherein said information carrying body has a photosensitive color transitivity responsive to ultraviolet rays.

15. A method of manufacturing a solar cell module according to claim 10, wherein said information carrying body has a thermally sensitive color transitivity.

16. A method of manufacturing a solar cell module according to claim 10, wherein said information carrying body has a hue similar to that of the surrounding area.

17. A method of manufacturing a solar cell module according to claim 10, wherein said information carrying body is transparent in the visible region.

18. A method of manufacturing a solar cell module according to claim 10, wherein said information to be stored in said information carrying body can be stored in a step of manufacturing the solar cell module.

* * * * *

UNITED STATES PATENT AND TRADEMARK OFFICE
CERTIFICATE OF CORRECTION

PATENT NO.    : 6,162,986
DATED         : December 19, 2000
INVENTOR(S)   : Hidenori Shiotsuka et al.

It is certified that error appears in the above-identified patent and that said Letters Patent is hereby corrected as shown below:

Column 1,
Line 17, "cross sectional" should read -- cross-sectional --; and
Line 54, "way" should read -- way, --.

Column 2,
Line 32, "above identified" should read -- above-identified --.

Column 3,
Line 9, "above listed" should read -- above-listed --; and
Line 25, "above listed" should read -- above-listed --.

Column 4,
Line 62, "cross sectional" should read -- cross-sectional --

Column 5,
Line 5, "cross sectional" should read -- cross-sectional --; and
Line 18, "cross sectional" should read -- cross-sectional --.

Column 8,
Line 51, "the" (first occurrence) should be deleted.

Column 10,
Line 41, "above" should read -- above --; and
Line 44, "IIowever," should read -- However, --.

Column 12,
Line 56, "ay" should read -- way --.

Column 14,
Line 65, "SiII$_4$," should read -- SiH$_4$, --; and "II$_2$" should read -- H$_2$ --.

UNITED STATES PATENT AND TRADEMARK OFFICE
CERTIFICATE OF CORRECTION

PATENT NO. : 6,162,986
DATED : December 19, 2000
INVENTOR(S) : Hidenori Shiotsuka et al.

It is certified that error appears in the above-identified patent and that said Letters Patent is hereby corrected as shown below:

Column 15,
Line 44, "Amagnetic" should read -- A magnetic --.

Column 16,
Line 7, "above described" should read -- above-described --.

Signed and Sealed this

Thirtieth Day of October, 2001

Attest:

NICHOLAS P. GODICI
Attesting Officer   Acting Director of the United States Patent and Trademark Office